US008691709B2

(12) United States Patent
Kikuchi (10) Patent No.: US 8,691,709 B2
(45) Date of Patent: Apr. 8, 2014

(54) METHOD OF FORMING METAL CARBIDE BARRIER LAYERS FOR FLUOROCARBON FILMS

(75) Inventor: Yoshiyuki Kikuchi, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 135 days.

(21) Appl. No.: 13/244,371

(22) Filed: Sep. 24, 2011

(65) Prior Publication Data
US 2013/0078799 A1 Mar. 28, 2013

(51) Int. Cl.
*H01L 21/461* (2006.01)

(52) U.S. Cl.
USPC .......................................... 438/781; 438/778

(58) Field of Classification Search
USPC .................................. 438/781, 778
See application file for complete search history.

(56) References Cited

U.S. PATENT DOCUMENTS

| | | | |
|---|---|---|---|
| 5,324,813 | A | 6/1994 | Hougham et al. |
| 6,265,779 | B1 | 7/2001 | Grill et al. |
| 6,337,290 | B1 | 1/2002 | Akahori et al. |
| 6,448,655 | B1 | 9/2002 | Babich et al. |
| 6,593,650 | B2 | 7/2003 | Towle et al. |
| 6,759,321 | B2 | 7/2004 | Babich et al. |
| 6,818,990 | B2 | 11/2004 | DelaRosa et al. |
| 6,846,737 | B1 | 1/2005 | Towle et al. |
| 7,049,209 | B1 | 5/2006 | Dalton et al. |
| 2009/0134518 | A1 | 5/2009 | Horigome |
| 2011/0081500 | A1 | 4/2011 | Zhao et al. |
| 2011/0081503 | A1 | 4/2011 | Zhao et al. |

FOREIGN PATENT DOCUMENTS

WO 2010084759 A1 7/2010

OTHER PUBLICATIONS

United States Patent and Trademark Office, International Search Report and Written Opinion for related international application No. PCT/US12/55608, mailed Dec. 7, 2012, 13pp.

*Primary Examiner* — Allen Parker (57) ABSTRACT

A method of forming metal carbide barrier layers for fluorocarbon films in semiconductor devices is described. The method includes depositing a fluorocarbon film on a substrate and depositing a metal-containing layer on the fluorocarbon film at a first temperature, where the metal-containing layer reacts with the fluorocarbon film to form a metal fluoride layer at an interface between the metal-containing layer and the fluorocarbon film. The method further includes heat-treating the metal-containing layer at a second temperature that is greater than the first temperature, wherein the heat-treating the metal-containing layer removes fluorine from the metal fluoride layer by diffusion through the metal-containing layer and forms a metal carbide barrier layer at the interface between the metal-containing layer and the fluorocarbon film, and wherein the metal-containing layer survives the heat-treating at the second temperature without blistering or pealing.

20 Claims, 7 Drawing Sheets

| STACK # | FILM STACK PREPARATION | INSPECTION OF FILM STACK |
|---|---|---|
| 1 | CF/Ta(6 nm) → 350°C anneal (12 hrs) | No film blistering or pealing |
| 2 | CF/Ta(15 nm) → 350°C anneal (12 hrs) | Film blistering |
| 3 | CF/Ta(30 nm) → 350°C anneal (12 hrs) | Film blistering and pealing |
| 4 | CF/Ta(6 nm) → 350°C anneal (4 hrs) → SiC → 350°C anneal (12 hrs) | No film blistering or pealing |
| 5 | CF/Ta(6 nm)/SiC → 350°C anneal (12 hrs) | Film blistering and pealing |
| 6 | CF/Ta(6 nm)/Cu(150 nm)/Ti(10 nm) → 350°C anneal (12 hrs) | Film blistering and pealing |

METHOD OF FORMING METAL CARBIDE BARRIER LAYERS FOR FLUOROCARBON FILMS

FIELD OF THE INVENTION

The present invention generally relates to semiconductor devices and methods of manufacturing semiconductor devices. In particular, it relates to methods for forming metal carbide barrier layers for fluorocarbon films used with copper metallization in semiconductor devices.

BACKGROUND OF THE INVENTION

An integrated circuit contains various semiconductor devices and a plurality of conducting metal paths that provide electrical power to the semiconductor devices and allow these semiconductor devices to share and exchange information. Within the integrated circuit, metal layers are stacked on top of one another using intermetal or interlayer dielectric layers that insulate the metal layers from each other.

Normally, each metal layer must form an electrical contact to at least one additional metal layer. Such electrical contact is achieved by etching a hole (i.e., a via) in the interlayer dielectric that separates the metal layers, and filling the resulting via with a metal to create an interconnect. Metal layers typically occupy etched pathways in the interlayer dielectric. A "via" normally refers to any feature such as a hole, line or other similar feature formed within a dielectric layer that provides an electrical connection through the dielectric layer to a conductive layer underlying the dielectric layer. Similarly, metal layers connecting two or more vias are normally referred to as trenches.

The introduction of copper (Cu) metal into multilayer metallization schemes for manufacturing integrated circuits reduces the wiring resistance, and low permittivity or low dielectric constant (low-k) materials may be used as interlayer dielectrics (ILDs) to reduce the parasitic capacitance. Cu is known to easily diffuse into common integrated circuit materials such as silicon and dielectric materials, wherein Cu is a mid-bandgap impurity. Therefore, a diffusion barrier layer is formed onto dielectric materials and other materials in the integrated circuits to surround the Cu and prevent diffusion of the Cu into the integrated circuit materials. Fluorocarbon (CF) films comprising or consisting of fluorine and carbon are promising materials for use as low-k ILDs and other applications. However, a problem that is commonly encountered when attempting to integrate fluorocarbon films into semiconductor devices is weak adhesion between the fluorocarbon film and other material films in the devices which can result in blistering and/or peeling of the other material films from the fluorocarbon film.

SUMMARY OF THE INVENTION

Embodiments of the invention describe a method of forming metal carbide barrier layers for fluorocarbon films that may be used with Cu metallization in semiconductor devices. According to some embodiments, the metal carbide barrier layers can contain tantalum (Ta), titanium (Ti), tungsten (W), cobalt (Co), or manganese (Mn), or a combination thereof.

According to one embodiment, the method includes providing a fluorocarbon film on a substrate and depositing a metal-containing layer on the fluorocarbon film at a first temperature, wherein the depositing forms a metal fluoride layer at an interface between the metal-containing layer and the fluorocarbon film. The method further includes heat-treating the metal layer at a second temperature that is greater than the first temperature, wherein the heat-treating removes fluorine from the metal fluoride layer by diffusion through the metal-containing layer and forms a metal carbide barrier layer at the interface between the metal-containing layer and the fluorocarbon film, and wherein the metal-containing layer survives the heat-treating at the second temperature without blistering or pealing.

According to another embodiment, the method further includes removing the metal-containing layer following the heat-treating of the metal-containing layer. According to yet another embodiment, the method includes depositing an additional metal-containing layer on the fluorocarbon film at a third temperature following the removing of the metal-containing layer, wherein the additional metal-containing layer forms an additional metal fluoride layer at an interface between the additional metal-containing layer and the fluorocarbon film. The method further includes heat-treating the additional metal-containing layer at a fourth temperature that is greater than the third temperature, wherein the heat-treating the additional metal-containing layer removes fluorine from the additional metal fluoride layer by diffusion through the additional metal-containing layer and forms an additional metal carbide barrier layer at the interface between the additional metal-containing layer and the fluorocarbon film. In still another embodiment, the method further includes removing the additional metal-containing layer following the heat-treating of the additional metal-containing layer at the fourth temperature.

DETAILED DESCRIPTION OF SEVERAL EMBODIMENTS

Methods for forming metal carbide barrier layers for fluorocarbon films that may be used with Cu metallization in semiconductor devices are described in various embodiments. The metal carbide barrier layers are effective in preventing Cu from diffusing from a Cu metal line into the fluorocarbon film and effective in preventing fluorine diffusion into the Cu metal line.

There is a general need in semiconductor manufacturing for new methods for integrating low-k fluorocarbon films with barrier materials used in Cu metallization in order to enable the use of these films in advanced semiconductor devices. A problem that is commonly encountered when attempting to integrate a fluorocarbon film with a metal-containing barrier material, such as Ta metal, involves a fluorination reaction that forms a metal fluoride reaction product at the interface between the fluorocarbon film and the metal-containing barrier material. Further, upon heat-treating, the metal fluoride reaction product may diffuse into the fluorocarbon film and lead to reduced adhesion between the fluorocarbon film and the barrier material. The reduced adhesion can eventually result in film blistering and/or peeling of the barrier material from the fluorocarbon film.

One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention, but does not denote that they are present in every embodiment. Thus, the appearances of the terms "one embodiment" or "an embodiment" in various places throughout this specification are not necessarily referring to the same embodiment of the invention.

Figure 1:
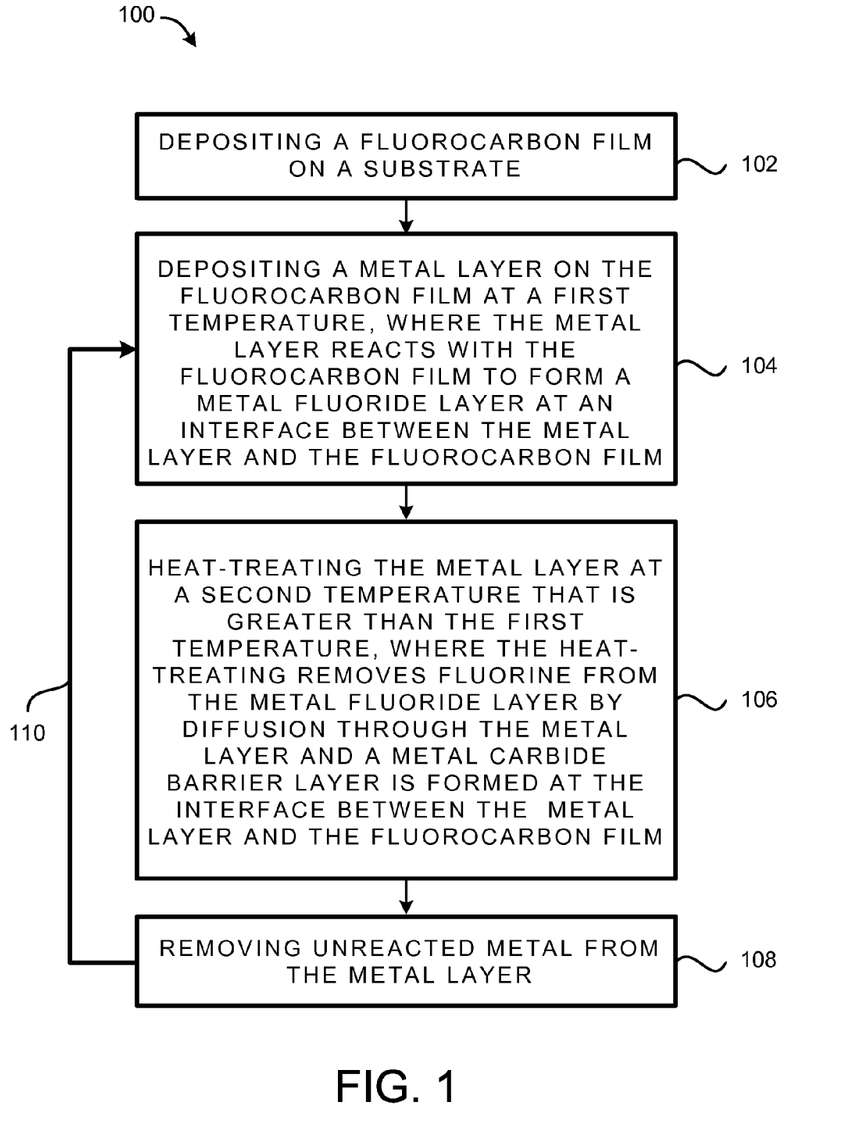
FIG. 1 is a flow diagram for forming a metal carbide barrier layer on a fluorocarbon film according to embodiments of the invention.

FIG. 1 is a flow diagram 100 for forming a metal carbide barrier layer on a fluorocarbon film according to embodiments of the invention, and FIGS. 2A-2H schematically show formation of a tantalum carbide barrier layer on a fluorocarbon film according to embodiments of the invention. In 102, a fluorocarbon film 204 is deposited on a substrate 200. The substrate 200 can, for example, be a semiconductor substrate, such as a silicon substrate, a silicon germanium substrate, a germanium substrate, a glass substrate, a LCD substrate, or a compound semiconductor substrate, such as GaAs. The substrate can be of any size, for example, a 200 mm wafer, a 300 mm wafer, a 450 mm wafer, or an even larger wafer or substrate. In the example shown in FIG. 2A, the substrate 200 contains an etch stop film 202 (e.g., SiN, $SiO_2$, SiON, SiCO, SiCN, or amorphous carbon) formed thereon.

According to some embodiments, the fluorocarbon film 204 may be deposited onto the substrate 200 by a plasma formed using a radio frequency (RF) plasma source or by a plasma formed using a microwave plasma source. In one example, the microwave plasma source can include a radial line slot antenna (RLSA), as shown in FIGS. 5-8. Although some embodiments describe depositing fluorocarbon films using plasma processing, other embodiments are not so limited. According to some embodiments, the fluorocarbon film 204 may be deposited on the substrate 200 by a non-plasma process, for example by atomic layer deposition (ALD), chemical vapor deposition (CVD), or filament-assisted CVD (FACVD).

According to one embodiment, the fluorocarbon film 204 may be deposited on substrate 200 from a process gas containing fluorine and carbon that is excited by a microwave plasma source to form plasma. The process gas containing fluorine and carbon can include a $C_aF_b$ gas (wherein a and b are integers greater than or equal to unity) that contains, for example, $C_4F_4$, $C_4F_6$, $C_6F_6$, or $C_5F_8$, or a combination of two or more thereof. Other $C_aF_b$ gases are also contemplated and may be used. In one example, $C_5F_8$ gas is very well suited for depositing fluorocarbon films because the $C_5F_8$ molecule has a C≡C triple bond that is not broken during the plasma processing due to the low electron temperature (e.g., less than about 5 eV (electron volts), or between about 1 eV and about 2 eV) in a microwave plasma and thus the C≡C molecular unit is incorporated into the fluorocarbon film 204.

Gas flow rates of the $C_aF_b$ gas can be less than 500 standard cubic centimeters per minute (sccm), less than 200 sccm, or less than 100 sccm. In some examples, the process gas can further contain a noble gas (e.g., helium (He) or argon (Ar)), nitrogen ($N_2$), or both a noble gas (e.g., He or Ar) and $N_2$. Gas flow rates of the noble gas and $N_2$ gas can be less than 500 sccm, less than 200 sccm, or less than 100 sccm. The gas pressure in the plasma processing chamber can be less than 100 mTorr (milli-Torr), less than 50 mTorr, less than 30 mTorr, or less than 20 mTorr, for example. The substrate holder can be maintained at a temperature greater than 200° C., greater than 300° C., or greater than 400° C. In some examples, the substrate holder can be maintained at a temperature greater than 310° C., greater than 320° C., or greater than 330° C. In one example, the substrate holder can be maintained at a temperature of approximately 330° C. The microwave plasma power applied by the microwave plasma source can, for example, be between 10 Watts (W) and 200 W, or between 20 W and 100 W. A substrate holder supporting the substrate may be biased with a radio frequency (RF) power source. The RF bias power applied to the substrate holder can, for example, be between 10 W and 200 W, or between 20 W and 100 W.

Figure 2A:
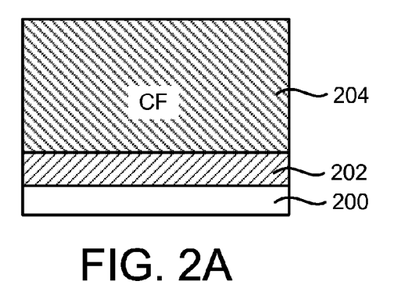
FIGS. 2A-2H schematically show formation of a tantalum carbide barrier layer on a fluorocarbon film according to embodiments of the invention.
Figure 2B:
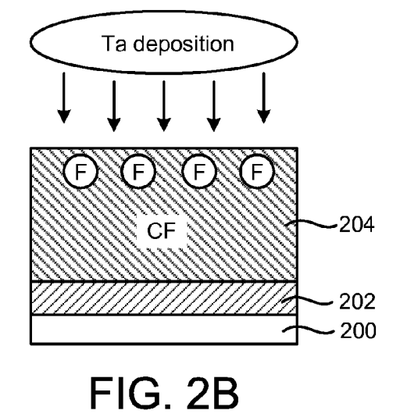
Figure 2C:
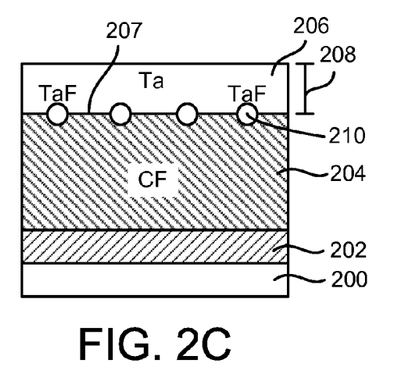

In 104, a metal-containing layer 206 with a thickness 208 is deposited on the fluorocarbon film 204 at a first temperature (FIGS. 2B-2C). The first temperature can, for example, be between −30° C. and 300° C., between −30° C. and 0° C., between 0° C. and 30° C., between 30° C. and 60° C., between 60° C. and 100° C., between 100° C. and 200° C., or between 200° C. and 300° C. According to some embodiments, the thickness 208 of the metal-containing layer 206 can be less than 15 nanometers (1 nm=$1\times10^{-9}$ m), less than 10 nm, less than 5 nm, between 5 nm and 10 nm, between 10 nm and less than 15 nm, or between 5 nm and less than 15 nm.

The metal-containing layer 206 may be deposited by physical vapor deposition (PVD) using a solid metal target, by atomic layer deposition (ALD), by chemical vapor deposition (CVD), by plasma-enhanced ALD (PEALD), or by plasma-enhanced CVD (PECVD), for example.

As shown in FIGS. 2A-2H, metal-containing layer 206 may contain Ta, but other embodiments of the invention contemplate the use of other metals than Ta in the metal-containing layer 206, for example titanium (Ti), tungsten (W), cobalt (Co), or manganese (Mn), or a combination thereof. The metal-containing layer 206 can contain or consist of a metal nitride, a metal oxide, a metal oxynitride, a metal carbide, or an elemental form of a metal (e.g., Ta metal). FIG. 2C further shows a metal fluoride (e.g., TaF) layer 210 formed by a fluorination reaction near or at an interface 207 between the metal-containing layer 206 and the fluorocarbon film 204. Ta metal is commonly utilized as a component of a diffusion barrier layer in Cu metallization but Ta metal has high reactivity towards fluorine in the fluorocarbon film 204. The inventors have realized that the metal fluoride layer 210 (e.g., TaF, or more generally $TaF_x$, where x=1-5) that is formed in the fluorination reaction near or at the interface 207 needs to be addressed when attempting to integrate the fluorocarbon film 204 with the metal-containing layer 206.

Figure 2D:
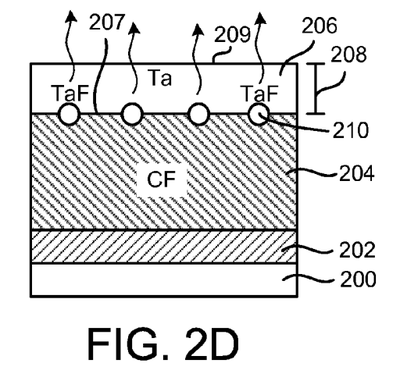

In 106, the film structure depicted in FIG. 2D is heat-treated at a second temperature that is greater than the first temperature. The second temperature can be between 200° C. and greater than 500° C., between 200° C. and 300° C., between 300° C. and 350° C., between 350° C. and 400° C., between 400° C. and 450° C., between 450° C. and 500° C., or greater than 500° C. In one example, the heat-treating may be performed in the presence of inert gas (e.g., helium (He), argon (Ar) or nitrogen ($N_2$)) at pressures between about 1 Torr and about 1 atmosphere. The heat-treating may be performed for a time period greater than 10 minutes, greater than 1 hour, or greater than 4 hours, for example.

The heat-treating in 106 is thought to reduce the amount of fluorine (F) near the interface 207 between the metal-containing layer 206 and the fluorocarbon film 204 through fluorine removal from the metal fluoride layer 210 by diffusion of volatile fluorine-containing species (e.g., TaF and/or HF) through the metal-containing layer 206 to an external surface 209 of the metal-containing layer 206. Thereafter, the volatile fluorine-containing species are removed from the external surface 209 of the metal-containing layer 206 into the gaseous or vacuum environment above the external surface 209. Further, as depicted in FIG. 2D, the heat-treating forms a metal carbide barrier layer 212 (e.g., TaC) near or at the interface 207 between the metal-containing layer 206 and the fluorocarbon film 204.

The inventors have discovered that the thickness 208 of the metal-containing layer 206 strongly affects whether the metal-containing layer 206 survives the heat-treating at the second temperature without blistering or pealing during a standard tape test. According to embodiments of the invention, the metal-containing layer 206 has a thickness 208 that allows diffusion of the volatile fluorine-containing species through the metal-containing layer 206 to the external surface 209 of the metal-containing layer 206. If the metal-containing layer 206 is too thick, then the volatile fluorine-containing species are unable to diffuse through the metal-containing layer 206 to the external surface 209 of the metal-containing layer 206 but instead react with the fluorocarbon film 204. The reaction of the volatile fluorine-containing species with fluorocarbon film 204 can result in decomposition of the fluorocarbon film 204 and weaken the adhesion between the fluorocarbon film 204 and the metal-containing layer 206. This can result unacceptable blistering and/or pealing of the metal-containing layer 206 from the fluorocarbon film 204. This is schematically shown in FIGS. 3A-3C.

Figure 3A:
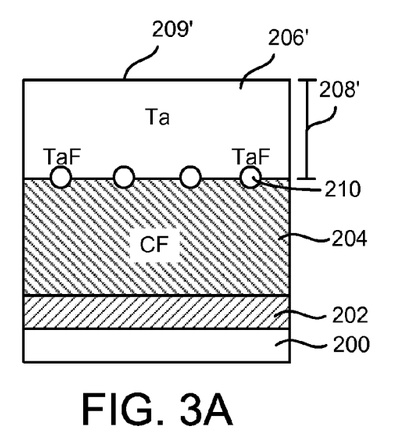
FIGS. 3A-3C schematically show formation of a tantalum carbide barrier layer with poor adhesion to a fluorocarbon film.
Figure 3B:
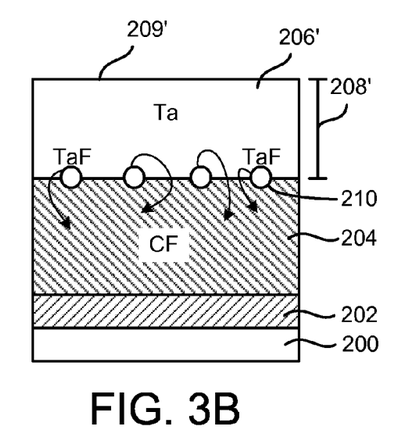
Figure 3C:
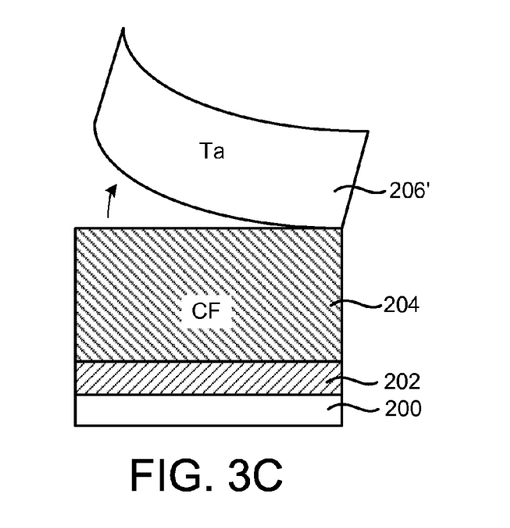

In FIG. 3A, the metal-containing layer 206' has a thickness 208' that is too thick to allow diffusion of the volatile fluorine-containing species from the metal fluoride layer 210 through the metal-containing layer 206' to an external surface 209' of the metal-containing layer 206' where they can be removed into the gaseous or vacuum environment above the external surface 209'. In one example, the metal-containing layer 206' is a Ta metal layer and the thickness 208' is 15 nm or greater. The heat-treating results in a reaction of the volatile fluorine-containing species from the metal fluoride layer 210 with the fluorocarbon film 204 (FIG. 3B). The reaction may include metal-catalyzed decomposition of the fluorocarbon film 204 in the presence of water impurities (not shown) in the fluorocarbon film 204. The reaction weakens the adhesion between the fluorocarbon film 204 and the metal-containing layer 206' and can result in blistering and/or pealing of the metal-containing layer 206' from the fluorocarbon film 204 as depicted in FIG. 3C.

Referring back to FIG. 2E, according to one embodiment of the invention, Cu metal (not shown) may be deposited on the metal-containing layer 206 and the combination of metal-containing layer 206 and the metal carbide barrier layer 212 may act as a diffusion barrier to prevent Cu metal diffusion into the fluorocarbon film 204.

Figure 2E:
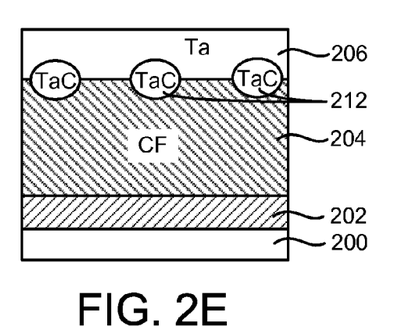

According to another embodiment of the invention, following the heat-treating in 106, the film structure depicted in FIG. 2E may be hermetically sealed by depositing a capping layer (not shown) on the metal-containing layer 206. The capping layer can, for example, contain silicon nitride or silicon carbide.

Figure 2F:
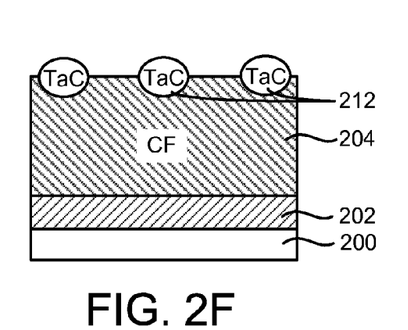

Referring now to FIGS. 1 and 2F, according to one embodiment of the invention, the method further includes in 108, removing the metal-containing layer 206 following the heat-treating of the metal-containing layer 206. In some examples, the metal-containing layer 206 may be removed by dry etching or wet etching. Thereafter, Cu metal (not shown) may be deposited on the metal carbide barrier layer 212 and the metal carbide barrier layer 212 may act as a diffusion barrier to prevent Cu metal diffusion into the fluorocarbon film 204.

According to one embodiment of the invention, the removal of the metal-containing layer 206 may be performed using a wet etching process. The wet etching process can, for example, include exposing the metal-containing layer 206 to a wet etching solution. The wet etching solution may be selected from a wide variety of water-based etching solutions used in semiconductor manufacturing, including, but not limited to, HF(aq), buffered HF(aq), HCOOH (formic acid), $NH_3+H_2O$, $NH_3+H_2O_2+H_2O$, $HCl+H_2O$, $HCl+H_2O_2+H_2O$, or $H_2SO_4+H_2O_2+H_2O$, or a combination thereof. Exemplary wet etching times are between 5 seconds and 10 minutes and wet etching solution compositions (by volume) and temperatures may include: $HF+H_2O$ (1:100, 23° C.), $NH_3+H_2O_2+H_2O$ (1:1:20, 60° C.), or $HCl+H_2O_2+H_2O$ (1:1:20, 60° C.).

According to another embodiment of the invention, the removal of the metal-containing layer 206 may be performed using a dry etching process. The dry etching process can include a thermal (non-plasma) process or a plasma process. The dry etching process can, for example, include exposing the metal-containing layer 206 to a halogen-containing etch gas or HCOOH gas. The halogen-containing gas can, for example, contain $F_2$, $Cl_2$, $Br_2$, HF, HCl, HBr, HI, $BCl_3$, or $NF_3$, or a combination of two or more thereof. The halogen-containing gas can include a gas having the chemical formula $C_xF_z$ or $C_xH_yF_z$, where x, y and z are equal to unity or greater. The dry etching process can further include $N_2$ and/or Ar or He.

Although, the metal carbide barrier layer 212 is depicted as a discontinuous film in FIGS. 2E and 2F, in other examples the metal carbide barrier layer 212 may form a continuous film that is effective in preventing Cu metal diffusion into the fluorocarbon film 204.

Figure 2G:
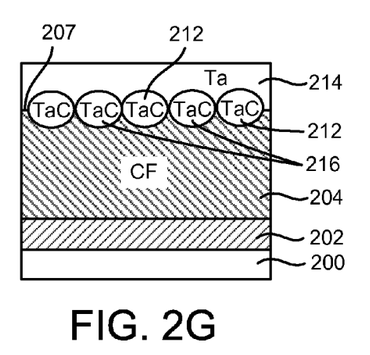

As shown by process arrow 110 in FIG. 1 and further depicted in FIG. 2G, the metal-containing deposition process may be repeated by depositing an additional metal-containing layer 214 on the fluorocarbon film 204. The deposition of the additional metal-containing layer 214 forms an additional metal fluoride layer (not shown) near or at the interface 207. Thereafter, the additional metal-containing layer 214 is heat-treated to remove fluorine from the additional metal fluoride layer by diffusion through the additional metal-containing layer 214 and form an additional metal carbide barrier layer 216 near or at the interface 207.

The additional metal-containing layer 214 may be deposited at the first temperature or at a third temperature that is different from the first temperature. The third temperature can, for example, be between −30° C. and 300° C., between −30° C. and 0° C., between 0° C. and 30° C., between 30° C. and 60° C., between 60° C. and 100° C., between 100° C. and 200° C., or between 200° C. and 300° C. Similarly, the additional metal-containing layer 214 may be heat-treated at the second temperature or at a fourth temperature that is different from the second temperature. The fourth temperature can be between 200° C. and greater than 500° C., between 200° C. and 300° C., between 300° C. and 350° C., between 350° C. and 400° C., between 400° C. and 450° C., between 450° C. and 500° C., or greater than 500° C.

The additional metal-containing layer 214 can contain or consist of a metal nitride, a metal oxide, a metal oxynitride, a metal carbide, or the elemental form of a metal (e.g., Ta metal). The additional metal-containing layer 214 can contain titanium (Ti), tungsten (W), cobalt (Co), or manganese (Mn), or a combination thereof. In one example, the additional metal-containing layer 214 may contain or consist of the same metal as the metal-containing layer 206. In other examples, the additional metal-containing layer 214 may contain or consist of a different metal than the metal-containing layer 206. According to one embodiment of the invention, Cu metal (not shown) may be deposited on the additional metal-containing layer 214 and the combination of additional metal-containing layer 214, the additional metal carbide barrier layer 216, and the metal carbide barrier layer 212 may act as a diffusion barrier to prevent Cu metal diffusion into the fluorocarbon film 204.

Figure 2H:
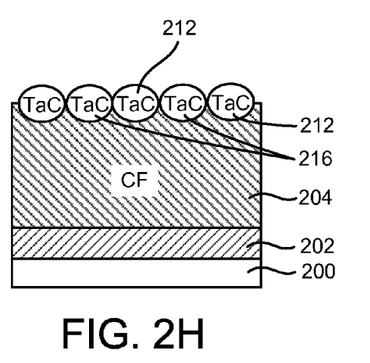

Referring now to FIGS. 1 and 2H, according to one embodiment of the invention, the method further includes in 108, removing the additional metal-containing layer 214 following the heat-treating of the additional metal-containing layer 214. In some examples, the additional metal-containing layer 214 may be removed by dry etching or wet etching.

According to one embodiment of the invention, Cu metal (not shown) may be deposited on the additional metal carbide barrier layer 216 and on the metal carbide barrier layer 212 and those barrier layers may act as a diffusion barrier to prevent Cu metal diffusion into the fluorocarbon film 204.

Figure 4:
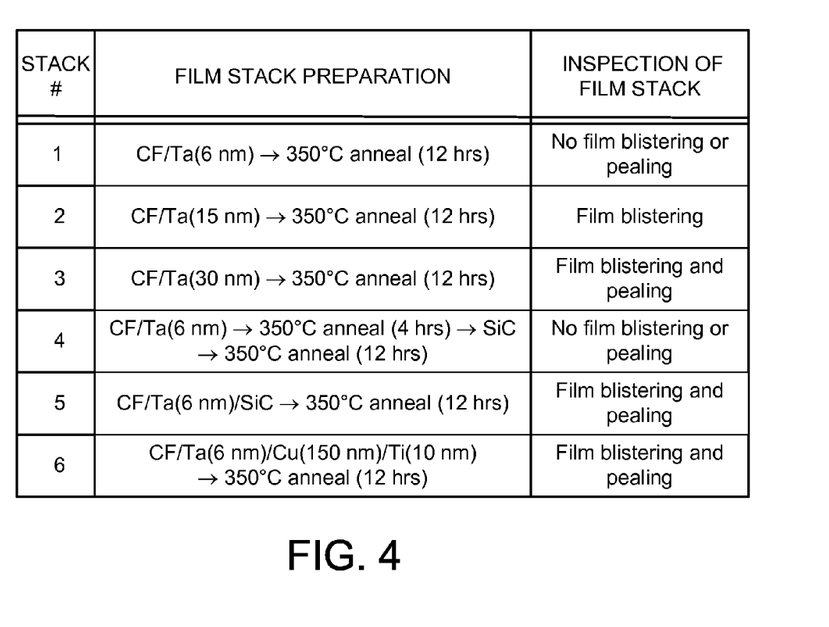
FIG. 4 shows adhesion test results for tantalum carbide barrier layers formed on fluorocarbon films.

FIG. 4 shows adhesion test results for tantalum carbide barrier layers formed on fluorocarbon films. Film stack 1 was prepared by depositing a 6 nm thick Ta metal layer by PVD on a fluorocarbon film. Film stacks 2 and 3 were prepared in a similar way and contained a 15 nm thick Ta metal layer and a 30 nm thick Ta metal layer, respectively. Film stacks 1-3 were heat-treated at 350° C. for 12 hours in 1 atm (atmosphere) of $N_2$ gas and thereafter visually inspected for defects. The visual inspection of the heat-treated film stack 1 did not show any signs of blistering and no peeling was observed using a standard tape test. However, visual inspection of heat-treated film stack 2 showed film blistering and visual inspection of heat-treated film stack 3 showed film blistering, and pealing was observed using a standard tape test.

Film stack 4 was prepared in a similar way as film stack 1 but was heat-treated at 350° C. for 4 hours instead of 12 hours, and further included depositing a hermetic SiC capping layer on the heat-treated Ta metal layer and performing a second heat-treating at 350° C. for 12 hours. Visual inspection of film stack 4 following the second heat-treating did not shown any sign of blistering and no peeling pealing was observed using a standard tape test. This observation indicates that additional TaF is not formed at the interface between the fluorocarbon film and the Ta metal layer during the second heat-treating. Film stack 5 was prepared in a similar way as film stack 4 but the heat-treating at 350° C. for 4 hours before depositing the hermetic SiC capping layer was omitted. Visual inspection of film stack 5 following the heat-treating showed film blistering, and pealing was observed using a standard tape test. Film stack 6 was prepared by depositing a 6 nm thick Ta metal layer on a fluorocarbon film, depositing a 150 nm thick Cu film on the Ta metal layer, and depositing a 10 nm thick Ti metal layer on the Cu film. Film stack 6 was then heat-treated at 350° C. for 12 hours in 1 atm of $N_2$ gas. Visual inspection of film stack 6 following the heat-treating showed film blistering, and pealing was observed using a standard tape test.

The results in FIG. 4 show that heat-treating of a thin (i.e., 6 nm thick) Ta metal layer deposited on a fluorocarbon film allowed for removing volatile fluorine-containing species from the interface between the fluorocarbon film and the Ta metal layer and prevented blistering and pealing of the Ta metal layer (Film stacks 1 and 4). The heat-treating used processing conditions (temperature, time, and pressure) commonly found in semiconductor device processing. This allows integration of fluorocarbon film with many metals and metal-containing materials encountered in semiconductor device manufacturing.

However, thick (i.e., 15 nm and 30 nm) Ta metal layers did not allow volatile TaF species to diffuse through the Ta metal layers and this resulted in blistering and pealing of the Ta metal layer (Film stacks 2 and 3). The results further show that if a thin (6 nm) Ta metal film was sealed before the heat-treating, then the heat-treating was not effective in removing volatile TaF species from the interface between the fluorocarbon film and the Ta metal layer and this resulted in blistering and pealing of the Ta metal layer from the fluorocarbon film (Film stacks 5 and 6).

Figure 5:
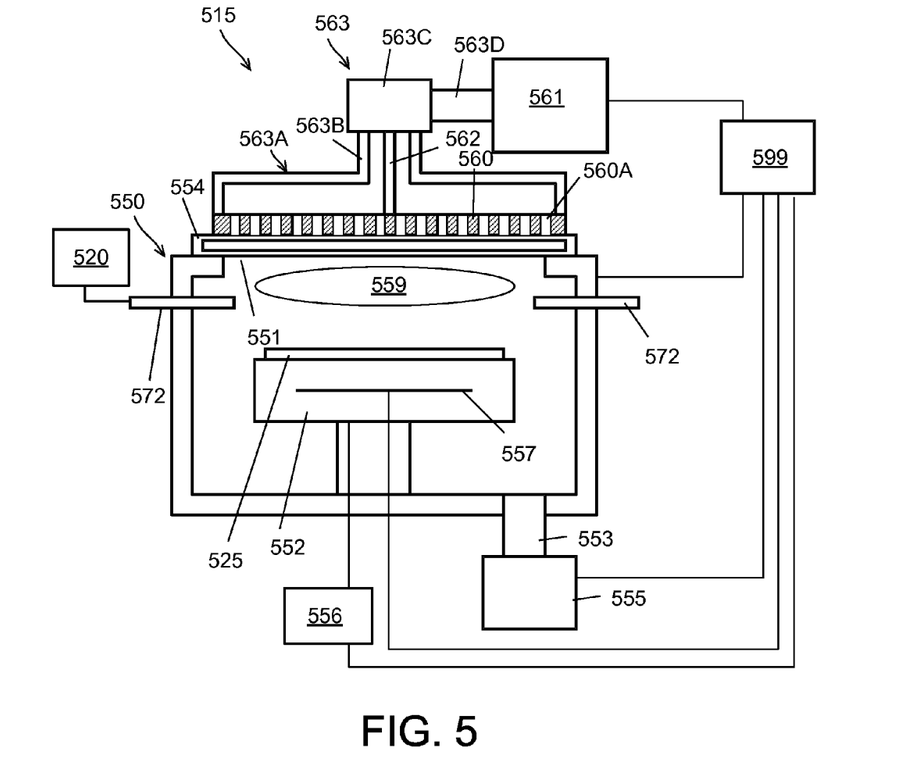
FIG. 5 is a schematic diagram of a plasma processing system containing a radial line slot antenna (RLSA) plasma source for depositing a fluorocarbon film on a substrate according to one embodiment of the invention.

FIG. 5 is a schematic diagram of a plasma processing system containing a RLSA plasma source for depositing a fluorocarbon film on a substrate according to one embodiment of the invention. The plasma produced in the plasma processing system 515 is characterized by low electron temperature and high plasma density. The plasma processing system 515 can, for example, be a TRIAS™ SPA processing system from Tokyo Electron Limited, Akasaka, Japan. The plasma processing system 515 contains a plasma processing chamber 550 having an opening portion 551 in the upper portion of the plasma processing chamber 550 that is larger than a substrate 525. A cylindrical dielectric top plate 554 made, for example, of quartz, aluminum nitride or aluminum oxide is provided to cover the opening portion 551.

Gas lines 572 are located in the side wall of the upper portion of plasma processing chamber 550 below the top plate 554. In one example, the number of gas lines 572 can be 16 (only two of which are shown in FIG. 5). Alternatively, a different number of gas lines 572 can be used. The gas lines 572 can be circumferentially arranged in the plasma processing chamber 550, but this is not required for the invention. A process gas can be evenly and uniformly supplied into a plasma region 559 in plasma processing chamber 550 from the gas lines 572. A process gas containing fluorine and carbon may be supplied by a gas source 520. The process gas containing fluorine and carbon can include a $C_aF_b$ gas that contains $C_4F_4$, $C_4F_6$, $C_6F_6$, or $C_5F_8$, or a combination of two or more thereof. Other $C_aF_b$ gases are also contemplated and may be used. Gas flow rates of the $C_aF_b$ gas can be less than 500 sccm, less than 200 sccm, or less than 100 sccm. In some examples, the process gas can further contain He, Ar, $N_2$, or both He and $N_2$, or both Ar and $N_2$. Gas flow rates of the Ar and $N_2$ gas can be less than 500 sccm, less than 200 sccm, or less than 100 sccm. The gas pressure in the plasma processing chamber can be less than 100 mTorr, less than 50 mTorr, less than 30 mTorr, or less than 20 mTorr, for example. Although not shown in FIG. 5, the process gas may also be provided into the plasma region 559 through the slot antenna 560.

In the plasma processing system 515, microwave power is provided to the plasma processing chamber 550 through the top plate 554 via a slot antenna 560 having a plurality of slots 560A. The slot antenna 560 faces the substrate 525 to be processed and the slot antenna 560 can be made from a metal plate, for example copper. In order to supply the microwave power to the slot antenna 560, a waveguide 563 is disposed on the top plate 554, where the waveguide 563 is connected to a microwave power supply 561 for generating electromagnetic wave at a microwave frequency of about 2.45 GHz, for example. The waveguide 563 contains a coaxial waveguide 563A with a lower end connected to the slot antenna 560, a coaxial waveguide 563B connected to the upper surface side of the circular (coaxial) waveguide 563A, and a coaxial waveguide converter 563C connected to the upper surface side of the coaxial waveguide 563B. Furthermore, a rectangular waveguide 563D is connected to the input of the coaxial waveguide converter 563C and an output for the microwave power supply 561.

Inside the coaxial waveguide 563B, an axial portion 562 (or inner conductor) of an electroconductive material is coaxially provided with the outer conductor, so that one end of the axial portion 562 is connected to the central (or nearly central) portion of the upper surface of slot antenna 560, and the other end of the axial portion 562 is connected to the upper surface of the coaxial waveguide 563B, thereby forming a coaxial structure. The microwave power can, for example, be between about 0.5 W/cm$^2$ and about 4 W/cm$^2$. Alternatively, the microwave power can be between about 0.5 W/cm$^2$ and about 3 W/cm$^2$. The microwave irradiation may contain a microwave frequency of about 300 MHz to about 10 GHz, for example about 2.45 GHz, and the plasma may contain an electron temperature of less than or equal to 5 eV, including 1, 1.5, 2, 2.5, 3, 3.5, 4, 4.5 or 5 eV, or any combination thereof. In other examples, the electron temperature can be below 5 eV, below 4.5 eV, below 4 eV, or even below 3.5 eV. In some examples, the electron temperature can be between 1 and 1.5 eV, between 1.5 and 2 eV, between 2 and 2.5 eV, between 2.5 and 3 eV, between 3.0 and 3.5 eV, between 3.5 and 4.0 eV, or between 4.0 and 4.5 eV. The plasma may have a density of about $1 \times 10^{11}$/cm$^3$ to about $1 \times 10^{13}$/cm$^3$, or higher.

In addition, in the plasma processing chamber 550, a substrate holder 552 is provided opposite the top plate 554 for supporting and heating a substrate 525 (e.g., a wafer). The substrate holder 552 contains a heater 557 to heat the substrate 525, where the heater 557 can be a resistive heater. Alternatively, the heater 557 may be a lamp heater or any other type of heater. Furthermore the plasma processing chamber 550 contains an exhaust line 553 connected to the bottom portion of the plasma processing chamber 550 and to a vacuum pump 555. The substrate holder 552 can be maintained at a temperature greater than 200° C., greater than 300° C., or greater than 400° C. In some examples, substrate holder 552 can be maintained at a temperature greater than 310° C., greater than 320° C., or greater than 330° C., for example. In one example, the substrate holder 552 can be maintained at a temperature of approximately 330° C.

The plasma processing system 515 further contains a substrate bias system 556 configured to bias the substrate holder 552 and the substrate 525 for generating a plasma and/or controlling energy of ions that are drawn to a substrate 525. The substrate bias system 556 includes a substrate power source configured couple power to the substrate holder 552. The substrate power source contains a RF generator and an impedance match network. The substrate power source is configured to couple power to the substrate holder 552 by energizing an electrode in the substrate holder 552. A typical frequency for the RF bias can range from about 0.1 MHz to about 100 MHz, and can be 13.56 MHz. In some examples, the RF bias can be less than 1 MHz, for example less than 0.8 MHz, less than 0.6 MHz, less than 0.4 MHz, or even less than 0.2 MHz. In one example, the RF bias can be about 0.4 MHz. Alternatively, RF power is applied to the electrode at multiple frequencies. The substrate bias system 556 is configured for supplying RF bias power can be between 0 W and 100 W, between 100 W and 200 W, between 200 W and 300 W, between 300 W and 400 W, or between 400 W and 500 W. RF bias systems for plasma processing are well known to those skilled in the art. Further, the substrate bias system 556 includes a DC voltage generator capable of supplying DC bias between −5 kV and +5 kV to the substrate holder 552.

The substrate bias system 556 is further configured to optionally provide pulsing of the RF bias power the pulsing frequency can be greater than 1 Hz, for example 2 Hz, 4 Hz, 6 Hz, 8 Hz, 10 Hz, 20 Hz, 30 Hz, 50 Hz, or greater. Exemplary RF bias power can be less than 100 W, less than 50 W, or less than 25 W, for example. It is noted that one skilled in the art will appreciate that the power levels of the substrate bias system 556 are related to the size of the substrate 525 being processed. For example, a 300 mm Si wafer requires greater power consumption than a 200 mm wafer during processing.

Still referring to FIG. 5, a controller 599 includes a microprocessor, a memory, and a digital I/O port capable of generating control voltages sufficient to communicate and activate inputs of the plasma processing system 515 as well as monitor outputs from the plasma processing system 515. Moreover, the controller 599 is coupled to and exchanges information with plasma processing chamber 550, the vacuum pump 555, the heater 557, the substrate bias system 556, and the microwave power supply 561. A program stored in the memory is utilized to control the aforementioned components of plasma processing system 515 according to a stored process recipe. One example of controller 599 is a UNIX-based workstation. Alternatively, the controller 599 can be implemented as a general-purpose computer, digital signal processing system, etc.

Figure 6:
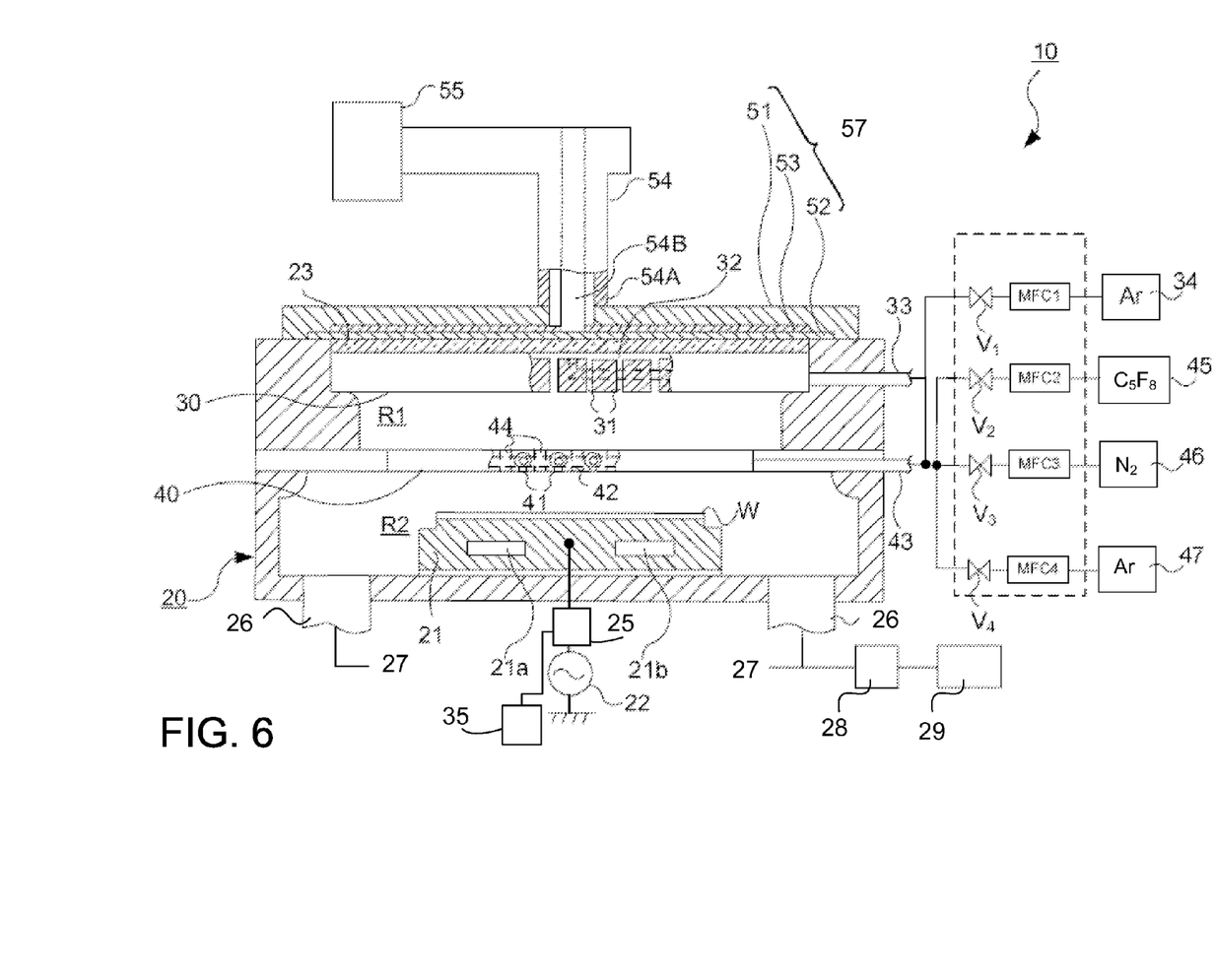
FIG. 6 is a schematic diagram of another plasma processing system containing a RLSA plasma source for depositing a fluorocarbon film on a substrate according to an embodiment of the invention.

FIG. 6 is a schematic diagram of a plasma processing system containing a radial line slot antenna (RLSA) plasma source for depositing a fluorocarbon film on a substrate according to another embodiment of the invention. As shown in this figure, plasma processing system 10 includes a plasma processing chamber 20 (vacuum chamber), an antenna unit 57 (RLSA), and a substrate holder 21. The interior of the plasma processing chamber 20 is roughly sectionalized into a plasma generation region R1, located below a plasma gas supply unit 30, and a plasma diffusion region R2 at the substrate holder 21 side. The plasma generated in the plasma generation region R1 can have an electron temperature of several electron volts (eV). When the plasma is diffused into the plasma diffusion region R2, wherein the film formation process is performed, the electron temperature of the plasma near the substrate holder 21 drops to a value of lower than about 2 eV. The substrate holder 21 is located centrally on a bottom portion of the plasma processing chamber 20 and serves as a mounting unit for mounting a substrate W. Within the substrate holder 21, there is provided an insulating member 21a, a cooling jacket 21b, and a temperature control unit, not shown in this figure, for controlling the substrate temperature.

A top portion of the plasma processing chamber 20 is open-ended. The plasma gas supply unit 30 is placed opposite to the substrate holder 21 and is sealed with the top portion of the plasma processing chamber 20 via sealing members, not shown in this figure, such as O rings. The plasma gas supply unit 30, which may also function as a dielectric window, is made of materials such as aluminum oxide or quartz, and its planar surface, which has a virtual disk shape, faces the substrate holder 21. A plurality of gas supply holes 31 are provided opposite to the substrate holder 21 on the planar surface of the plasma gas supply unit 30. The plurality of gas supply holes 31 communicate with a plasma gas supply port 33 via a gas flow channel 32. A plasma gas supply source 34 provides plasma gas such as Ar gas, $N_2$ gas, or other inert gases, into the plasma gas supply port 33. The plasma gas is then uniformly supplied into the plasma generation region R1 via the plurality of gas supply holes 31.

The plasma processing system 10 further includes a process gas supply unit 40, which is located substantially at the center of the plasma processing chamber 20 between the plasma generation region R1 and the plasma diffusion region R2. The process gas supply unit 40 is made of conducting materials such as aluminum alloy including magnesium (Mg) or stainless steel. Similar to the plasma gas supply unit 30, a plurality of gas supply holes 41 are provided on a planar surface of the process gas supply unit 40. The planar surface of the process gas supply unit 40 is positioned opposite to the substrate holder 21 and has a disk shape.

The plasma processing chamber 20 further includes exhaust lines 26 connected to the bottom portion of the plasma processing chamber 20, a vacuum line 27 connecting the exhaust line to a pressure controller valve 28 and to a vacuum pump 29. The pressure controller valve 28 may be used to achieve a desired gas pressure in the plasma processing chamber 20.

Figure 7:
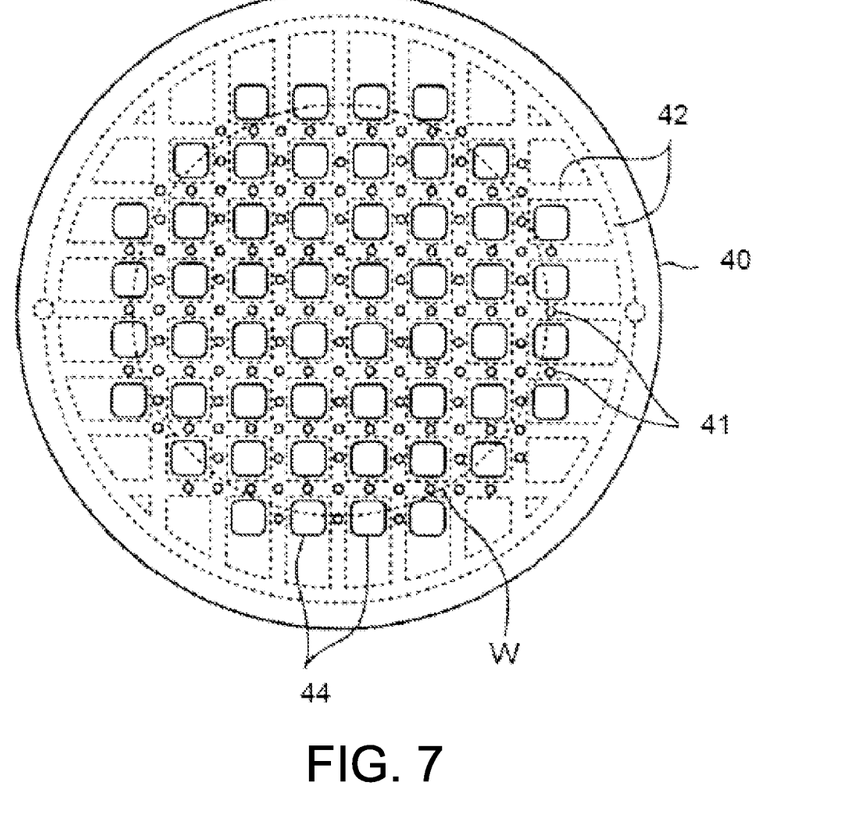
FIG. 7 illustrates a plan view of a gas supplying unit of the plasma processing system in FIG. 6.

A plan view of the process gas supply unit 40 is shown in FIG. 7. As shown in this figure, a grid-like gas flow channel 42, also called a shower plate, is formed within the process gas supply unit 40. The grid-like gas flow channel 42 communicates with an upper-end of the plurality of gas supply holes 41, which are formed in the vertical direction. The lower end of the plurality of gas supply holes 41 are openings facing the substrate holder 21. The plurality of gas supply holes 41 communicate with a process gas supply port 43 via the grid-patterned gas flow channel 42.

Further, a plurality of openings 44 are formed on to the process gas supply unit 40 such that the plurality of openings 44 pass through the process gas supply unit 40 in vertical direction. The plurality of opening 44 passes the plasma gas, e.g., argon (Ar) gas, helium (He) gas, or other inert gases, into the plasma diffusion region R2 on the side of the substrate holder 21. As shown in FIG. 7, the plurality of openings 44 are formed between the adjacent gas flow channels 42. The process gas is supplied, for example, from separate process gas supply sources 45 and 46 to the process gas supply port 43. The process gas supply sources 45 and 46 can provide $C_5F_8$ (or in general $C_aF_b$,) and $N_2$, respectively. A second Ar gas supply source 47 is provided for supplying additional Ar gas. According to some embodiments, any combination of Ar, $C_aF_b$, and $N_2$ may be flowed through the process gas supply unit 40 and/or through the plasma gas supply port 33. Furthermore, for example, the plurality of openings 44 may occupy a region on the process gas supply unit 40 that extends beyond a peripheral edge of the substrate W.

The process gas flows through the grid-like gas flow channel 42 and are uniformly supplied into the plasma diffusion region R2 via the plurality of gas supply holes 41. The plasma processing system 10 further includes four valves (V1-V4) and four flow rate controller (MFC1-MFC4) for respectively controlling a supply of the gases into the plasma processing chamber 20.

An external microwave generator 55 provides a microwave signal (or microwave energy) of a predetermined frequency, e.g., 2.45 GHz, to the antenna unit 57 via a coaxial waveguide 54. The coaxial waveguide 54 may include an inner conductor 54B and an outer conductor 54A. The microwave from the microwave generator 55 generates an electric field just below the plasma gas supply unit 30, in the plasma generation region R1, which in turn causes excitation of the process gas within the plasma processing chamber 20.

Figure 8:
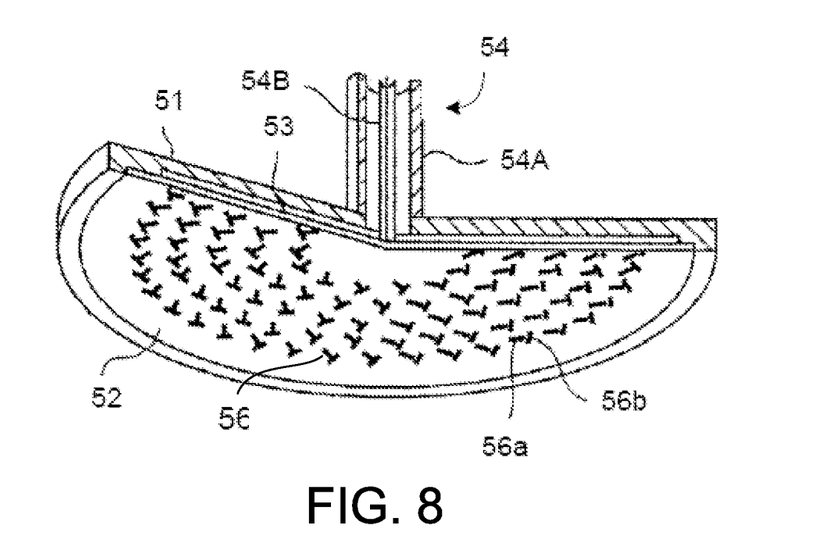
FIG. 8 illustrates a partial cross-sectional view of an antenna portion of the plasma processing system in FIG. 6.

FIG. 8 illustrates a partial cross-sectional view of the antenna unit 57 (RLSA). As shown in this figure, the antenna unit 57 may include a flat antenna main body 51, a radial line slot plate 52, and a dielectric plate 53 to shorten the wavelength of the microwave. The flat antenna main body 51 has a circular shape with an open-ended bottom surface. The radial line slot plate 52 is formed to close the open-ended bottom surface of the flat antenna main body 51. The flat antenna main body 51 and the radial line slot plate 52 are made of a conductive material with a flat hollowed circular shape waveguide.

A plurality of slots 56 is provided on the radial line slot plate 52 to generate a circular polarized wave. The plurality of slots 56 is arranged in a substantially T-shaped form having a slight gap there between, in a concentric circle pattern or a spiral pattern along a circumferential direction. Since the slots 56a and 56b are perpendicular to each other, a circular polarized wave containing two orthogonal polarized components is radiated, as a plane wave, from the radial line slot plate 52.

The dielectric plate 53 is made of a low loss dielectric material, e.g., aluminum oxide ($Al_2O_3$) or silicon nitride ($Si_3N_4$), which is located between the radial line slot plate 52 and the flat antenna main body 51. The radial line slot plate 52 is mounted on the plasma processing chamber 20 using sealing members (not shown), such that the radial line slot plate 52 is in close contact with a cover plate 23. The cover plate 23 is located on the upper surface of plasma gas supply unit 30 and is formed from a microwave transmissive dielectric material such as aluminum oxide ($Al_2O_3$).

An external high-frequency power supply source 22 is electrically connected to the substrate holder 21 via a matching network 25. The external high-frequency power supply source 22 generates an RF bias power of a predetermined frequency, e.g. 13.56 MHz, for controlling ions energy that are drawn to the substrate W. The power supply source 22 is further configured to optionally provide pulsing of the RF bias power the pulsing frequency can be greater than 1 Hz, for example 2 Hz, 4 Hz, 6 Hz, 8 Hz, 10 Hz, 20 Hz, 30 Hz, 50 Hz, or greater. The power supply source 22 is configured for supplying RF bias power can be between 0 W and 100 W, between 100 W and 200 W, between 200 W and 300 W, between 300 W and 400 W, or between 400 W and 500 W. It is noted that one skilled in the art will appreciate that the power levels of the power supply source 22 are related to the size of the substrate being processed. For example, a 300 mm Si wafer requires greater power consumption than a 200 mm wafer during processing. The plasma processing system 10 further includes DC voltage generator 35 capable of supplying DC voltage bias between about −5 kV and about +5 kV to the substrate holder 21.

During the forming of the fluorocarbon film, the plasma gas, e.g., argon (Ar) gas, may be introduced into the plasma processing chamber 20 using the plasma gas supply unit 30. On the other hand, the process gas may be introduced into the plasma processing chamber 20 using the process gas supply unit 40.

A plurality of embodiments for forming metal carbide barrier layers for fluorocarbon films used in semiconductor devices have been described. The metal carbide barrier layers have good adhesion to the fluorocarbon films and are effective in preventing Cu from diffusing from a Cu metal line into the fluorocarbon film.

The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. For example, the term "on" as used herein (including in the claims) does not require that a film "on" a substrate is directly on and in immediate contact with the substrate; there may be a second film or other structure between the film and the substrate.

Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A method of forming a semiconductor device, the method comprising:
    depositing a fluorocarbon film on a substrate;
    depositing a metal-containing layer on the fluorocarbon film at a first temperature, wherein the metal-containing layer reacts with the fluorocarbon film to form a metal fluoride layer at an interface between the metal-containing layer and the fluorocarbon film; and
    heat-treating the metal-containing layer at a second temperature that is greater than the first temperature, wherein the heat-treating the metal-containing layer removes fluorine from the metal fluoride layer by diffusion through the metal-containing layer and forms a metal carbide barrier layer at the interface between the metal-containing layer and the fluorocarbon film, and wherein the metal-containing layer survives the heat-treating at the second temperature without blistering or pealing.

2. The method of claim 1, wherein the metal-containing layer contains or consists of a metal nitride, a metal oxide, a metal oxynitride, a metal carbide, or an elemental form of a metal.

3. The method of claim 2, wherein the metal-containing layer contains tantalum (Ta), titanium (Ti), tungsten (W), cobalt (Co), or manganese (Mn), or a combination thereof.

4. The method of claim 1, wherein the first temperature is between −30° C. and 300° C. and the second temperature is greater than 300° C.

5. The method of claim 1, wherein the metal-containing layer is deposited by physical vapor deposition.

6. The method of claim 1, wherein the fluorocarbon film is deposited using a plasma formed from a process gas containing fluorine and carbon.

7. The method of claim 6, wherein the process gas containing fluorine and carbon comprises $C_4F_4$, $C_4F_6$, $C_6F_6$, or $C_5F_8$, or a combination of two or more thereof.

8. The method of claim 6, wherein the plasma is formed using a microwave plasma source containing a radial line slot antenna (RLSA).

9. The method of claim 1, further comprising:
    removing the metal-containing layer following the heat-treating of the metal-containing layer.

10. The method of claim 9, wherein the removing the metal-containing layer comprises dry etching or wet etching of the metal-containing layer.

11. The method of claim 9, further comprising:
    following the removing, depositing an additional metal-containing layer on the fluorocarbon film at a third temperature, wherein the additional metal-containing layer forms an additional metal fluoride layer at an interface between the additional metal-containing layer and the fluorocarbon film; and
    heat-treating the additional metal-containing layer at a fourth temperature that is greater than the third temperature, wherein the heat-treating the additional metal-containing layer removes fluorine from the additional metal fluoride layer by diffusion through the additional metal-containing layer and forms an additional metal carbide barrier layer at the interface between the additional metal-containing layer and the fluorocarbon film.

12. The method of claim 11, wherein the additional metal-containing layer contains the same metal as the metal-containing layer and contains or consists of a metal nitride, a metal oxide, a metal oxynitride, a metal carbide, or an elemental form of a metal.

13. The method of claim 11, wherein the additional metal-containing layer contains tantalum (Ta), titanium (Ti), tungsten (W), cobalt (Co), or manganese (Mn), or a combination thereof.

14. The method of claim 11, wherein the third temperature is between −30° C. and 300° C. and the fourth temperature is greater than 300° C.

15. The method of claim 11, further comprising:
    removing the additional metal-containing layer following the heat-treating of the additional metal-containing layer at the fourth temperature.

16. The method of claim 15, wherein the removing the additional metal-containing layer comprises dry etching or wet etching of the additional metal-containing layer.

17. The method of claim 15, further comprising:
    depositing Cu metal on the additional metal carbide barrier layer following the removing of the additional metal-containing layer.

18. The method of claim 11, further comprising:
    depositing Cu metal on the heat-treated additional metal-containing layer.

19. The method of claim 9, further comprising:
    depositing Cu metal on the metal carbide barrier layer following the removing of the metal-containing layer.

20. The method of claim 1, further comprising:
    depositing Cu metal on the metal-containing layer following the heat-treating of the metal-containing layer.

* * * * *